United States Patent
Cui et al.

(10) Patent No.: US 7,094,622 B1
(45) Date of Patent: Aug. 22, 2006

(54) POLYMER BASED TUNNELING SENSOR

(75) Inventors: Tianhong Cui, Ruston, LA (US); Jing Wang, Ruston, LA (US); Yongjun Zhao, Ruston, LA (US)

(73) Assignee: Louisiana Tech University Foundation, Inc., Ruston, LA (US)

( * ) Notice: Subject to any disclaimer, the term of this patent is extended or adjusted under 35 U.S.C. 154(b) by 0 days.

(21) Appl. No.: 10/648,927

(22) Filed: Aug. 27, 2003

(51) Int. Cl.
*H01L 21/00* (2006.01)

(52) U.S. Cl. .......................... 438/57; 438/63; 438/66; 438/82

(58) Field of Classification Search ................ 438/57, 438/59, 63, 64, 66, 67, 82
See application file for complete search history.

(56) References Cited

U.S. PATENT DOCUMENTS

| | | | |
|---|---|---|---|
| 5,502,667 A | 3/1996 | Bertin et al. | |
| 5,563,344 A | 10/1996 | Kaiser et al. | |
| 5,587,128 A | 12/1996 | Wilding et al. | |
| 5,726,480 A | 3/1998 | Pister | |
| 5,741,156 A | 4/1998 | Wilson | |
| 6,033,913 A | 3/2000 | Morozov et al. | |
| 6,183,829 B1 | 2/2001 | Daecher et al. | |
| 6,201,980 B1 | 3/2001 | Darrow et al. | |
| 6,346,376 B1 | 2/2002 | Sigrist et al. | |
| 6,393,913 B1 | 5/2002 | Dyck et al. | |
| 6,472,459 B1 * | 10/2002 | Morales et al. | 524/439 |
| 6,517,995 B1 * | 2/2003 | Jacobson et al. | 430/320 |
| 6,607,934 B1 * | 8/2003 | Chang et al. | 438/50 |
| 2002/0098611 A1 * | 7/2002 | Chang et al. | 438/50 |
| 2003/0047533 A1 * | 3/2003 | Reid et al. | 216/24 |

OTHER PUBLICATIONS

Roos, N., Luxbacher, T., Gilsner, T., Pfeiffer, K., Schulz, H. & Scheer, H.-C.; Nanoimprint Lithography with a Commercial 4 Inch Bond System for Hot Embossing, Presented at SPIE's Microlithography, Feb. 27-28, 2001, Santa Clara, CA.

Heyderman, L.J., Schift, H., David, C., Ketterer, B., Auf Der Maur, M. & Gobrecht, J.; Nanofabrication Using Hot Embossing Lithography and Electroforming; Microelectronic Engineering 57-58 (2001), pp. 375-380.

Scheer, H.-C., Schultz, H. & Lyebyedyev; Strategies for Wafer-Scale Hot Embossing Lithography; Proc. SPIE 4349, (2001) p. 86.

Lee, G., Chen, S., Huang, G., Sung, W. & Lin, Y.; Microfabricated Plastic Chips by Hot Embossing Methods and Their Applications for DNA Separation and Detection; Sensors and Actuators B 75 (2001), pp. 142-148.

Becker, H. & Dietz, W.; Microfluidic Devices for u-TAS Applications Fabricated by Polymer Hot Embossing; SPIE vol. 3515; Santa Clara, CA; Sep. 1998; pp. 177-181.

Becker, H. & Heim, U.; Hot Embossing as a Method for the Fabrication of Polymer High Aspect Ratio Structures; Sensors and Actuators 83 (2000) pp. 130-135.

(Continued)

*Primary Examiner*—Kevin M. Picardat
(74) *Attorney, Agent, or Firm*—Jones, Walker, Waechter, Poitevent, Carrere & Denegre, L.L.P.

(57) ABSTRACT

A process for fabricating a polymer based circuit by the following steps. A mold of a design is formed through a lithography process. The design is transferred to a polymer substrate through a hot embossing process. A metal layer is then deposited over at least part of said design and at least one electrical lead is connected to said metal layer.

10 Claims, 12 Drawing Sheets

OTHER PUBLICATIONS

Becker, H. & Heim, U; Silicon as Tool Material for Polymer Hot Embossing; Proceedings MEMS 99; 1999; pp. 228-231.

Muller, K.-D., Bacher, W. & Heckele, M.; 3D Diced Microcomponents Fabricated by Multi-Layer Hot Embossing; MME, 1999; Micro-Mechanics Europe, Gif-sur-Yvette, F, Sep. 27-28, 1999.

Roetting, O., Kohler, B., Reuther, F., Blum, H. & Bacher, W.; Production of Movable Metallic Microstructure by Aligned Hot Embossing and Reactive Ion Etching; Proceedings of SPIE—The International Society for Optical Engineering, vol. 3680; pp. 1038-1045.

Lin, L., Chiu, C., Bacher, W. & Heckele, M.; Microfabrication Using Silicon Mold Inserts and Hot Embossing; Proceedings of the International Symposium on Micro-Machine and Human Science; 1996; pp. 67-71.

Baski, A., Albrecht, T. & Quate, C.; Tunnelling Accelerometer; Journal of Micro-Scopy, 152; pp. 73-76, 1988.

Waltman, S. & Kaiser, W.; An Electron Tunneling Sensor; Sensors Actuators, vol. 19; pp. 201-210, 1989.

Kenny, T., Waltman, S. Reynolds, J. & Kaiser, W.; Micromachined Silicon Tunnel Sensor for Motion Detection; Appl. Phys. Lett., vol. 58; pp. 100-102; 1991.

Tang, W., Nguyen, T. & Howe, R.; Laterally Driven Polysilicon Resonant Microstructures; IEEE, Feb. 20-22, 1989, pp. 53-59.

Johnson, W. & Warne, L.; Electrophysics of Micromechanical Comb Actuators; Journal of Microelectromechanical Systems, vol. 4, 1995, pp. 49-59.

Ye, W. & Mukherjee, S.; Optimal Shape Design of Three-Dimensional MEMS with Applications to Electrostatic Comb Drives; Cornell University, Ithaca, NY; pp. 580-585.

Ye, W., Mukherjee, S. & MacDonald, N.; Optimal Shape Design of an Electrostatic Comb Drive in Microelectromechanical Systems; Journal of Microelectromechanical Systems, vol. 7; 1998; pp. 16-26.

Rodgers, M., Kota, S., Hetrick, J., Li, Z., Jensen, B., Krygowski, T., Miller, S., Barnes, S. & Burg, M.; A New Class of High Force, Low-Voltage, Compliant Actuation Systems; www.mems.sandi.gov; Albuquerque, NM.

Yeh, J., Hui, C. & Tien, N.; Electrostatic Model for an Asymmetric Combdrive; Journal of Microelectromechanical Systems, vol. 9; 2000; pp. 126-135.

Chan, E. & Dutton, R.: Electrostatic Micromechanical Actuator with Extended Range of Travel; Journal of Microelectromechanical Systems, vol. 9, 2000; pp. 321-328.

Hirano, T., Furuhata, T., Gabriel, K. & Fujita, H.; Design, Fabrication, and Operation of Submicron Gap Comb-Drive Microactuators; Journal of Microelectromechanical Systems, vol. 1; Mar. 1992; pp. 52-59.

Patterson, P., Han, D., Nguyen, H., Toshiyoshi, H., Chao, R. & Wu, M.; A Scanning Micromirror with Anular Comb Drive Actuation; 15th IEEE International Conference on Microelectromechanical Systems, 2002; pp. 544-547.

* cited by examiner

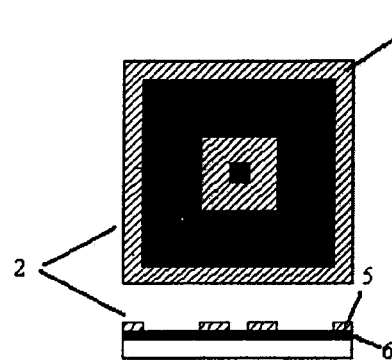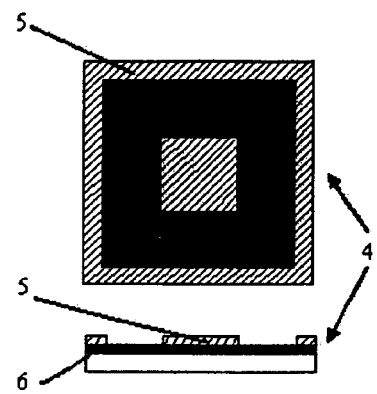
FIG.1(A)(1)          FIG.1(A)(2)
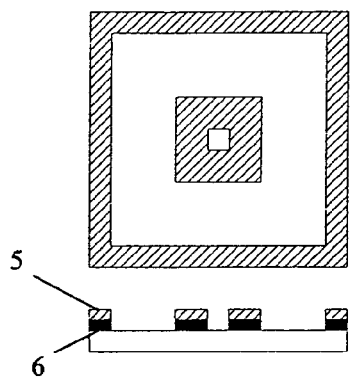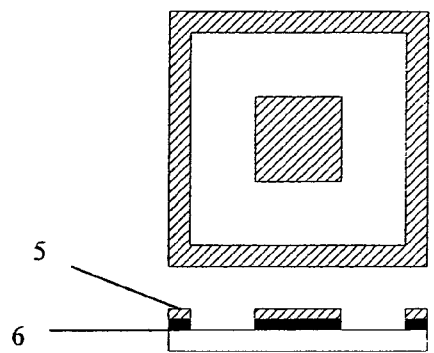
FIG. 1(B)(1)          FIG. 1(B)(2)

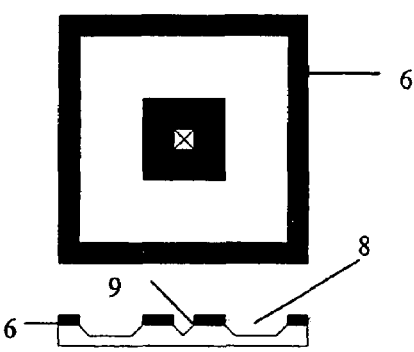
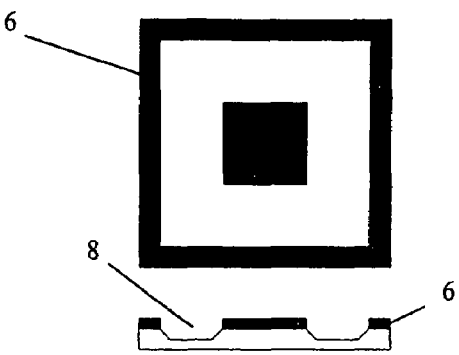
FIG. 1(C)(1)  FIG. 1(C)(2)
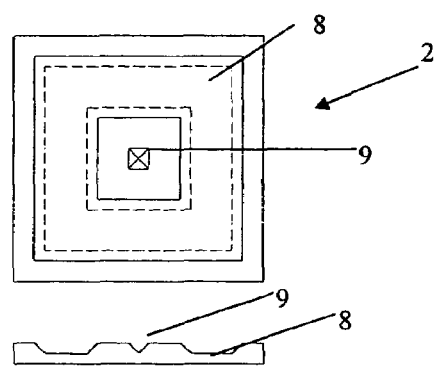
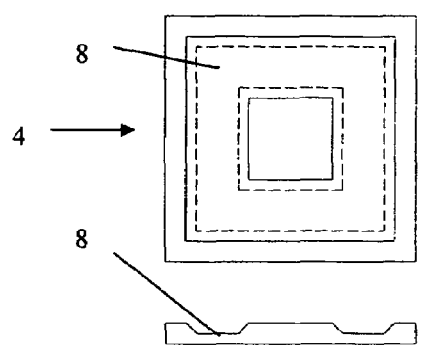
FIG. 1(D)(1)  FIG. 1(D)(2)
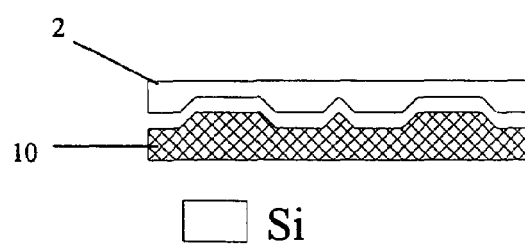
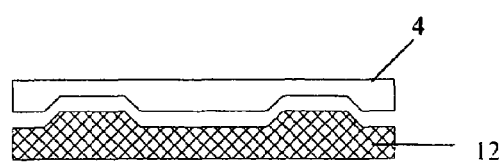
☐ Si   ▨ PMMA
FIG. 1(E)(1)  FIG. 1(E)(2)

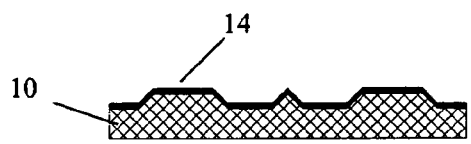
FIG. 1(F)(1)
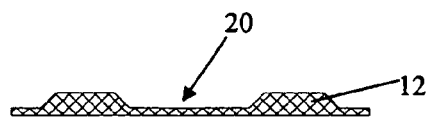
FIG. 1(F)(2)
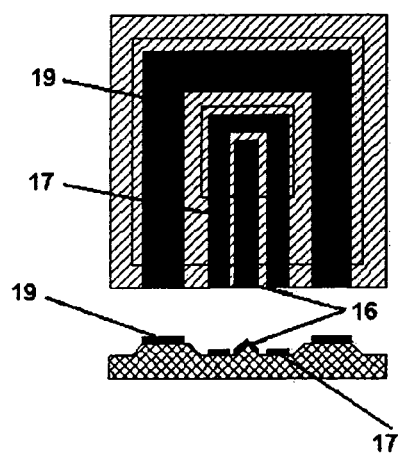
FIG. 1(G)(1)
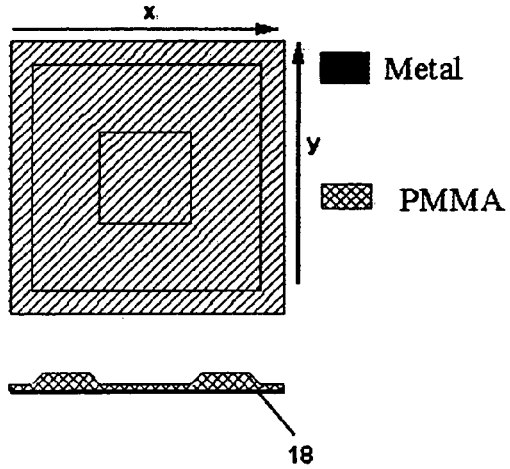
FIG. 1(G)(2)

FIG. 8 (a)
FIG. 8 (b)
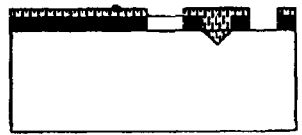
FIG. 8 (c)
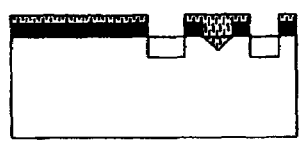
FIG. 8 (d)
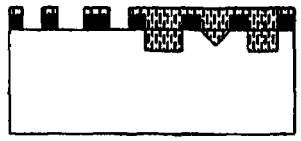
FIG. 8 (e)
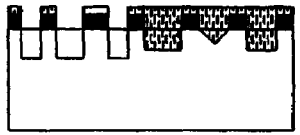
FIG. 8 (f)
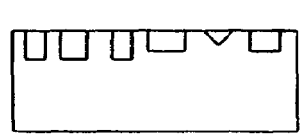
FIG. 8 (g)
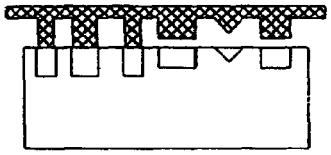
FIG. 8 (h)
PR ■ SiO₂ □ Si ▒ PMMA
FIG. 8 (i)
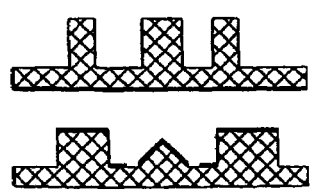
FIG. 8 (j)
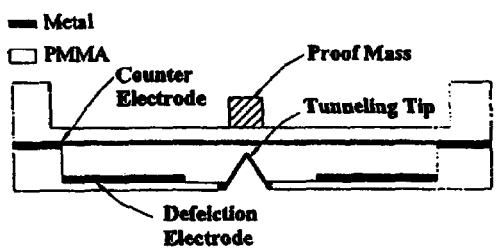
FIG. 8 (k)
Cross section of a membrane type PMMA-based tunneling sensor

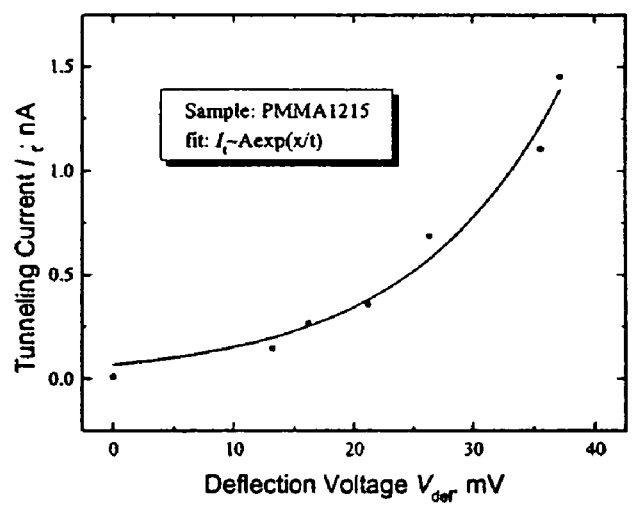
FIG. 9 The exponential relationship between tunneling currents and applied deflection voltages

POLYMER BASED TUNNELING SENSOR

STATEMENT REGARDING FEDERALLY SPONSORED RESEARCH OR DEVELOPMENT

This work was supported at least in part by the U.S. Government under grants: NSF/LEQSF (2001-04)-RII-02, DARPA DAAD19-02-1-0338, and NASA (2002)-Stennis-22. The U.S. government has certain rights in this invention.

CROSS-REFERENCE TO RELATED APPLICATION

None.

FIELD OF INVENTION

The present invention relates to electronic circuits formed from polymer materials. In particular, the present invention relates to circuits formed by a hot embossing process and tunneling sensor circuits.

BACKGROUND OF INVENTION

Polymer materials have been of great interest in the research and development of integrated circuits (IC) and micro-electro-mechanical systems (MEMS) recently due to their relatively low cost and much simpler processing techniques. Hot embossing of polymers is a promising alternative to the traditional silicon processes. It fulfills the demand for low-cost methods of mass production of micro-components and micro-systems. Also, the polymer materials for hot embossing are much cheaper than silicon wafers. Moreover, for hot embossing of polymer materials, complex micro-machining steps are only necessary to fabricate a master mold. Once the master mold is complete, the desired microstructures can be easily batch replicated by a hot embossing process.

Hot embossing is essentially the stamping of patterns into a polymer by raising the temperature above the polymer's glass transition point. During the last several years, hot embossing technology has been developed and applied in both laboratories and industry in a variety of fields. For example, hot embossing lithography (HEL) has been proposed as one of the most promising methods to replace e-beam or x-ray lithography as feature sizes are scaled down to nanometers for large area substrates (such as Si wafers of four inches or greater) and mass production. In HEL, a master mold is made by e-beam lithography and appropriate etching processes and then nano-patterns are batch imprinted on the large-scale substrates by hot embossing[1]–[3]. Hot embossing has been successfully applied to the fabrication of micro-fluidics devices on PMMA substrates for analytical chemistry and biomedical applications such as micro-total-analysis-systems (u-TAS), i.e., the lab-on-a-chip[4][5]. As mentioned previously, polymer micro-fabrication by hot embossing is also becoming increasingly important as the low-cost alternative to silicon or glass-based MEMS technologies[6]–[10].

An area of electronics which has promising potential application with polymer based circuits is tunneling sensors. Since the Nobel Prize was awarded to Binnig and Rohrer in 1986 for building the first scanning tunneling micro-scope (STM) by utilizing tunneling current, the possibility of producing a high-sensitivity tunneling displacement transducer has been actively explored. Several years after the advent of the first tunneling transducer[11], the sensors with displacement resolution approaching $10^{-4}$ Å/$\sqrt{Hz}$ were developed by Waltman[12] and Kenny[13]. In electron tunneling transducers, a 1% change in 1.5 nA current between tunneling electrodes corresponds to displacement fluctuation of less than 0.1 Å. This high sensitivity is independent of the lateral size of the electrodes because the tunneling current occurs between two metal atoms located at opposite electrode surfaces. Due to its high sensitivity and miniature size, micro-machined tunneling transducers make it possible to fabricate a high performance, small size, light mass, inexpensive accelerometer, which is in great demand in applications such as micro-gravity measurements, acoustic measurements, seismology, and navigation.

An electrostatic comb drive is one of the most important components in MEMS. A standard comb drive is formed by two sets of fingers with uniform gaps. One set is fixed on the substrate, which is called a fixed, or stationary finger. The other set is separate from the substrate and is called a moving finger. Moving fingers can move either laterally with the gaps fixed or vertically with the gaps closing to one side or the other. Normally the laterally moving comb drive works as an electrostatic actuator. In this way, it can give a constant force and has a large stroke distance. Gap-closing combs often work as a capacitive sensor. In this way, the capacitance variation is approximately inversely proportional to the square of gap distance. Much research and development on varieties of comb drives have been published since it was first presented by Tang, et al[14][15]. William A. Johnson and Larry K. Warn gave a thorough analysis on the physics of comb drives in their paper, "Electrophysics of Micro-mechanical Comb Actuators"[16]. W. Ye, et al presented an "optimal shape design of two and three dimensional comb drives", in which the quadratic or cubic force profiles, beside the linear one, under constant bias voltage by changing finger shape were given[17][18]. M. Steven Rodgers, et al presented an actuation system with large force, low-voltage, and efficient area[19]. Other investigations on the comb drive include an asymmetric comb drive in out-of-plane and torsional motions[20], a comb drive with extended travel[21], a sub-micron gap comb drive micro-actuators[22], and an angular comb drive actuator[23] have also been published.

However, despite the advances in polymer circuits and tunneling sensors, there is still a need for more efficient methods of manufacturing polymer circuits and it would be particularly useful to develop a polymer based tunneling sensor device. Therefore, it is an object of the present invention to provide a novel polymer based tunneling sensor which fulfills these needs. It is also an object of this invention to provide a novel reduced noise tunneling sensor.

SUMMARY OF THE INVENTION

The present invention includes a process for fabricating a polymer based micro-machine by the following steps. A mold of a design is formed through a lithography process. The design is transferred to a polymer substrate through a hot embossing process. A metal layer is then deposited over at least part of said design and at least one electrical lead is connected to said metal layer.

The invention also includes a polymer based micro-machine having a polymer substrate with a polymer micro-structure formed thereon. A metal layer is formed over at least part of the micro-structure and at least one electrical lead connected to the metal layer.

The invention further includes a reduced noise tunneling sensor. The reduced noise tunneling sensor has a first proof mass influencing a first tunneling tip. There is also a second proof mass having substantially the same mass as the first proof mass and also influencing a second tunneling tip. An indifference circuit is provided which receives a first signal related to movement of the first proof mass and a second signal related to movement of the second proof mass. The first and second signals have a useful signal component and a noise component and the indifference circuit subtracts the first and second signals, thereby doubling the useful signal component and eliminating the noise component.

BRIEF DESCRIPTION OF THE DRAWINGS

FIGS. 1A–1H illustrate a series of steps taken to manufacture one embodiment of the polymer tunneling sensor of the present invention.

FIGS. 8a–8k illustrates a series of steps in manufacturing a further alternate embodiment of the present invention.

FIG. 9 represents the exponential relationship between tunneling currents and applied deflection voltages.

DETAILED DESCRIPTION OF INVENTION

Figure 1H:
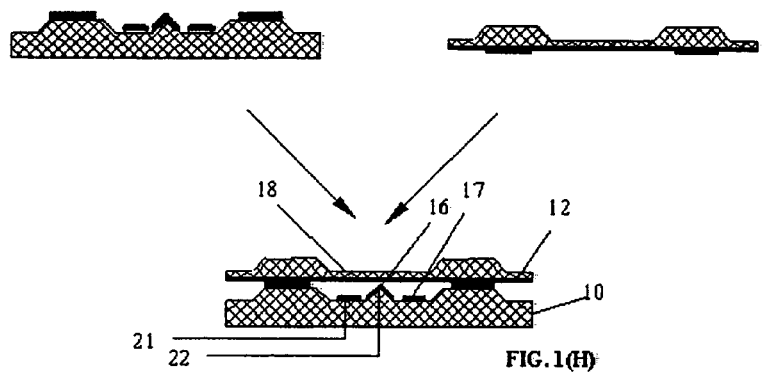

The present invention generally comprises micro-machine and possibly an electronic circuit related to the micro-machine formed on a polymer substrate. In one preferred embodiment of the invention, at least part of the micro-machine design is formed on the polymer substrate by a hot embossing technique. Although described in more detail in the references cited above, hot embossing imprinting generally consists of first and second heated plates in a vacuum environment which are pressed together with precisely controlled force. The first plate will contain a blank of polymer substrate and the second plate will contain a mold having the negative of the structure to be imprinted onto the polymer blank. While polymer material forming the blank may be any number of suitable polymers, one preferred embodiment uses poly-methyl-meth-acrylate (PMMA). The polymer blank and the mold are both heated to a regulated temperature and then brought together within set parameters (e.g., molding force, contact time, conditions of separation). Hot-embossing machines known in the art such as the model HEX 01/LT available from Jenoptik Mikrotechnik of Jena, Germany are acceptable for the embossing process employed in the present invention.

While the mold could be made of a number of materials, one of the most common materials is silicon (Si). The negative of the design to be imprinted on the polymer is generally formed on the Si mold through a conventional lithography process.

FIGS. 1A to 1G illustrate a series of steps comprising one preferred method of fabricating one preferred tunneling sensor of the present invention. In this embodiment, the process will include producing the sensor as two separate sections and therefore requiring two separate molds. FIG. 1(A)(1) shows a surface view and a side view of one mold and FIG. 1(A)(2) shows the same views for the second mold. For purposes of the present description, the figures on the left will be referred to as molds for the "lower" half of the sensor (the "lower mold") and the figures on the right will be referred to as the molds for the "upper" half of the sensor (the "upper mold"). However, it will be understood that the "upper" and "lower" half of the sensor are relative terms used for convenience in describing the figures. In practice, the sensor may be oriented any direction in which acceleration is to be measured.

FIG. 1(A)(1) shows how lower mold 2 and upper mold 4 both comprise a silicon substrate in the form of a double-side polished silicon (100) wafer coated with a 2 μm $SiO_2$ layer 6 on the wafer's top surface or the surface which is to be etched. A photoresist pattern 5 is formed on the surfaces of both lower mold 2 and upper mold 4. Next in FIGS. 1(B)(1) and 1(B)(2), hydrogen fluoride (HF) is used to etch away the $SiO_2$ area not protected by the photoresist. FIGS. 1(C)(1) and 1(C)(2) illustrate depressions 8 and V-shaped (or inverse pyramid shaped) pit 9 which are etched into the silicon of lower mold 2 and upper mold 4. The etching may be accomplished by any conventional method, although in one preferred embodiment the etching is carried out using potassium hydroxide (KOH). KOH will also remove the remaining photo-resist 5. The silicon molds are completed as shown in FIGS. 1(D)(1) and 1(D)(2) after the remaining SiO2 layer 6 is removed in any conventional manner such as etching with HF acid.

The hot embossing process may be carried out with any conventional embossing device such as the Jenoptik Mikrotechnik model HEX 01/LT mentioned above. A blank of polymer material such a 0.5 mm sheet of PMMA is positioned in the embossing device and pressed against the lower silicon mold 2 (FIG. 1(E)(1)) and the upper silicon mold 4 (FIG. 1(E)(2)) in order to form lower polymer structure 10 and upper polymer structure 12. One factor which must be taken into account when dealing with hot embossing processes is some small but inherent shrinkage of the PMMA in the lateral dimension (i.e., dimension x-y as in FIG. 1(G)(2)). For a typical 8.5 mm×8.5 mm PMMA section such as seen in FIGS. 1(G)(1) and (2), there will be an approximately 10% shrinkage in both the x and y dimension. One method to compensate for this shrinkage is to scale up the silicon molds 2 and 3 by these 10% dimensions. Another method of compensating for this shrinkage is to scale down the mask used to etch the metal sections seen in FIG. 1(G)(1). It is not critical to the final sensor structure whether the molds are scaled up or the mask for the metal lines is scale down. The main consideration is to have uniform alignment of successive layers throughout the fabrication process.

Thereafter, a metal layer 14 is deposited on the surface of lower structure 10 in FIG. 1(F)(1) and upper structure 12 has its bottom surface ground until it is approximately 50 μm thick at its thinnest point. The grinding may be accomplished with fine sandpaper and careful hand sanding with frequent measurements with a caliper or other thickness measuring device. Then a metal layer 18 is applied to the bottom surface of upper structure 12 as suggested in FIG. 1(G)(2). In one embodiment, a Ti/Au layer of 300 Å/1000 Å is applied with a sputtering process with the Au layer being the uppermost and the Ti layer acting as a bonding surface between the PMMA and Au layer. As suggested in FIG. 1(G)(1), the metal layer will be etched to form bonding area 19, deflection electrode 17, and tunneling tip 16. The bottom surface of upper structure 12 will form the bias electrode 18. The metal layers will then be patterned with photo-resist and etched where the photo-resist has been removed. In one preferred embodiment, the metal patterns will be etched using a $I_2$:KI:$H_2O$ solution in a 1:5:50 ratio. Although not explicitly shown in FIG. 1(G)(2), it will be understood that metal layer forming bias electrode 18 is uniformly form over the entire bottom surface of upper structure 12. Once the metal layers are completed on lower structure 10 and upper structure 12, these structures may be combined to form the tunneling sensor body as seen in FIG. 1H. The bonding point on lower structure 10 will be adhered to a portion of the metal layer 18 on upper structure 12. One preferred adhesion material for connecting the two structures is conductive epoxy. However, any method of connecting the two structures which does not impair the functioning of the tunneling sensor is intended to come within the scope of the present invention. FIG. 1H also suggests how electrical leads 21 and 22 will be connected to deflection electrode 17 and tunneling tip 16, respectively. Although not explicitly shown, those skilled in the art will recognize a metal lead may extend from bias electrode 18 also. As is know in the art, tunneling sensors measure acceleration by detecting a change in the position of biasing electrode 18 relative to tunneling tip 16. In the embodiment of FIG. 1H, leads 21 and 22 will be connected to a circuit (one example of which is discussed below) which will measure an increase or decrease in the distance between the tunneling tip 16 and the bias electrode 18. In the embodiment shown, this distance change is measured by quantifying the increase or decrease in the tunneling current. However, those skilled in the art will recognize the change in distance between tunneling tip 16 and biasing electrode 18 may be quantified in different ways. For example, a circuit may be constructed wherein the deflection electrodes 17 apply a varying voltage to maintain the bias electrode 18 at a predetermined distance from tunneling tip 16 (i.e., to maintain a constant tunneling current). When an accelerative force tends to move bias electrode 18 toward or away from tunneling tip 16, a feedback mechanism increases or decreases the voltage at deflection electrodes 17 as is needed to maintain bias electrode 18 at the predetermined distance from tunneling tip 16. The voltage increase or decrease at the deflection electrodes will indicate the magnitude and direction of the acceleration. These and all other methods of measuring the placement of bias electrode 18 are intended to come within the scope of the present invention.

Figure 2A:
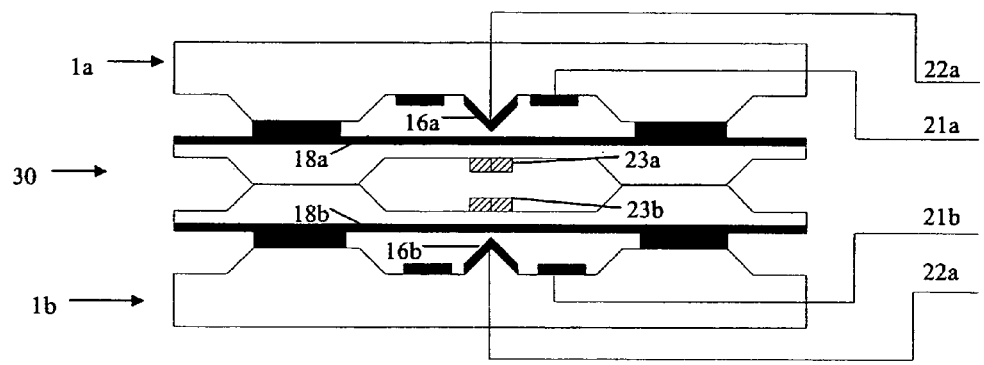
FIGS. 2A and 2B illustrate one embodiment of the dual-tunneling sensor of the present invention.
Figure 2B:
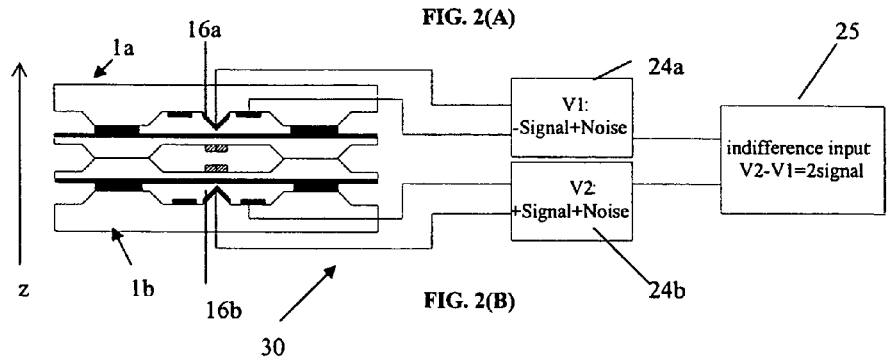

Another embodiment of the present invention includes a novel tunneling sensor design which reduces low frequency noise from various sources, most notably thermal expansion and contraction of the tunneling sensor's components. FIG. 2A illustrates one embodiment of this tunneling sensor 30. In FIG. 2A, two tunneling sensors such as described above are positioned adjacent one another. In the embodiment shown, the tunneling sensors 1a and 1b are positioned with their upper structures 12 in contact and the two sensors connected by an adhesive or another conventional means. While there are many ways the two tunneling sensors may be positioned together, it is important that the two tunneling sensors be oriented on the same axis along which they will detect motion and that the sensors are oriented to produce opposite signals for a given motion along that axis. For example, FIG. 2B illustrates how tunneling tips 16a and 16b are oriented in opposite directions along the "Z" axis of motion. Returning to FIG. 2A, there is also shown two proof masses 23a and 23b. The proof mass will typically be a given amount of material from which the sensor structure is constructed. In the present embodiment, the proof mass is a section of PMMA material remaining after hot embossing. The size of the proof mass will vary depending on the particular tunneling senor design. In the embodiment of FIG. 1H, the proof mass is simply the mass of the PMMA above the bias electrode along with the mass of the electrode metal layer. One important design consideration in the embodiment of FIG. 2A is that the mass of the two proof masses be substantially equal. It is also preferable that other aspects (design, materials of construction, etc.) of sensors 1a and 1b be substantially the same.

FIG. 2B best illustrates the dual tunneling sensor 30 in operation. The sensor 30 is positioned to measure acceleration along the shown "Z" axis. If sensor 30 is accelerating upward, the proof mass 23a in senor 1a will tend to move away from tunneling tip 16a, producing what is designated a negative signal component plus a noise component (see signal representation V1 in box 24a). On the other hand, proof mass 23b will tend to move toward tunneling tip 16b, producing what is designated a positive signal component plus a noise component (see signal representation V2 in box 24b). Because sensors 1a and 1b, are virtually identical and subject to the same environmental conditions, they should produce virtually identical noise components in the signal. The signals V1 and V2 will be passed to indifference input circuit 25 where the effect will be to subtract the two signals. Since the useful signal components should be of equal magnitude, but opposite sign while the noise component should be of equal magnitude and sign, the output of indifference input circuit 25 will be twice the magnitude of the useful signal with all the noise component removed.

Figure 3:
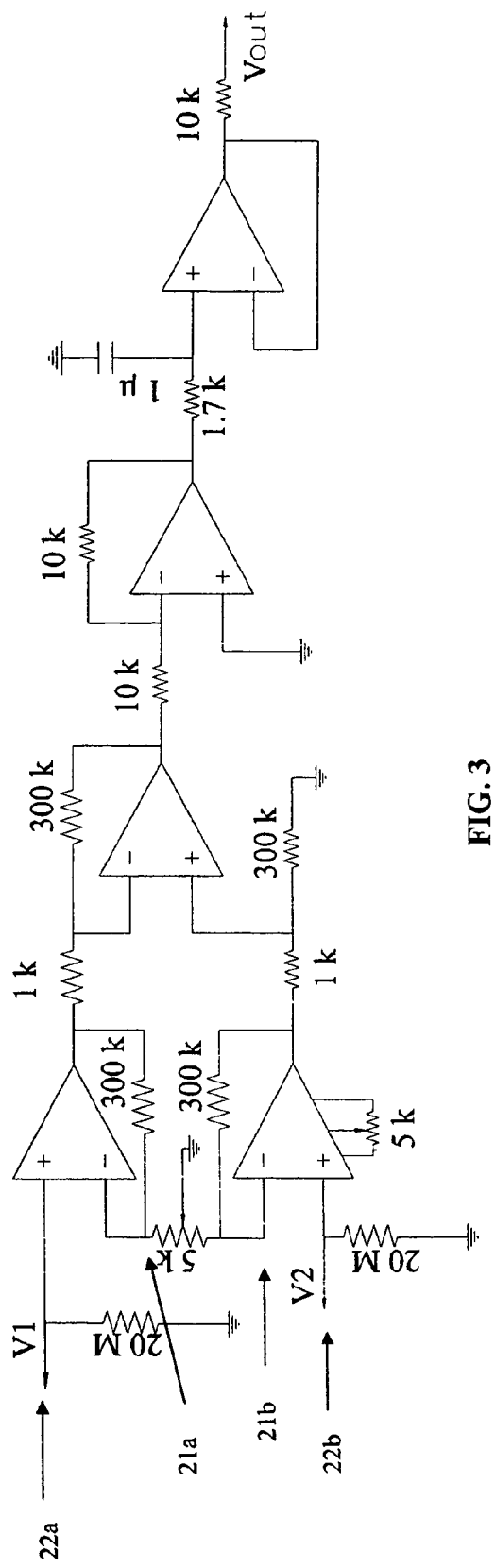
FIG. 3 illustrates one embodiment of an input indifference circuit applicable to the present invention.

FIG. 3 illustrates one embodiment of a indifference input circuit 25 which could be used in conjunction with the present invention. The components of the circuit are shown in FIG. 3. The op-amps will typically all have the same characteristics. In one embodiment, the op-amps all have a gain rating of $10^6$. However, many other input indifference circuits are well known in the art and could be used in place of the circuit shown in FIG. 3. Furthermore, while the dual sensor arrangement illustrated in FIG. 2B is shown using polymer based tunneling sensors, it should be understood that a plurality of substantially identical tunneling sensors constructed of any conventional material (such as silicon) could also be employed and are within the scope of the present invention.

Figure 4A:
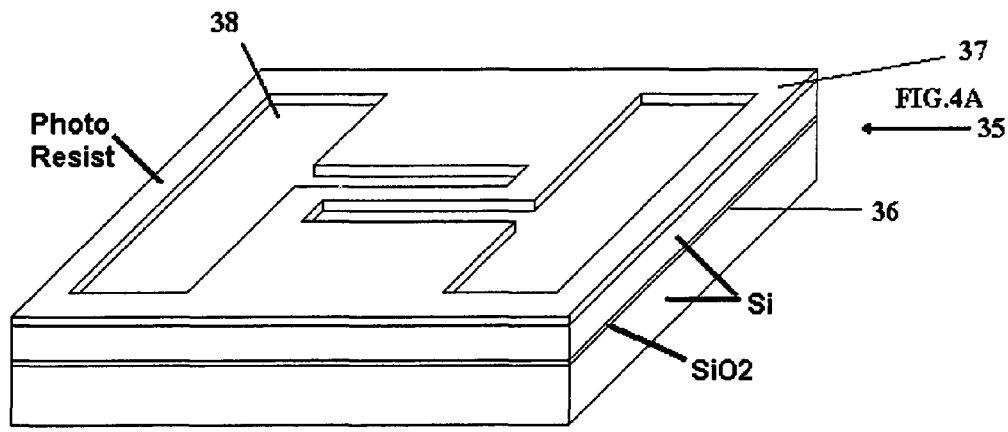
FIGS. 4A–4H illustrate a series of steps taken to manufacture an alternate embodiment of the polymer tunneling sensor of the present invention.
Figure 4B:
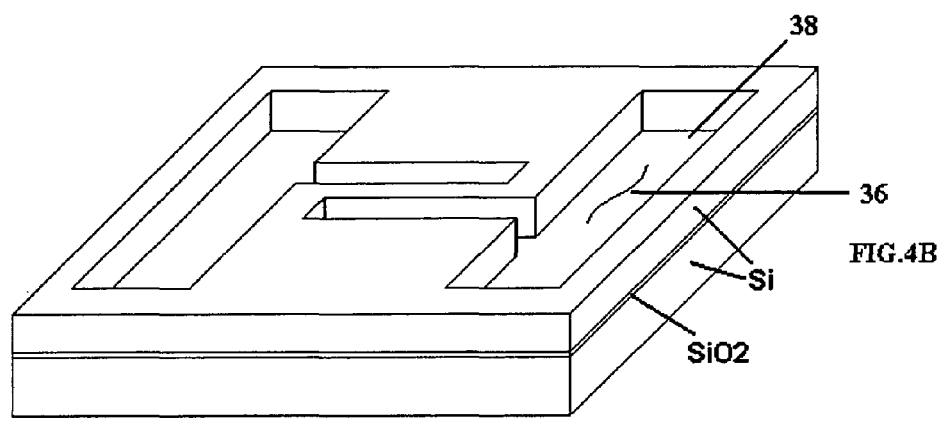
Figure 4C:
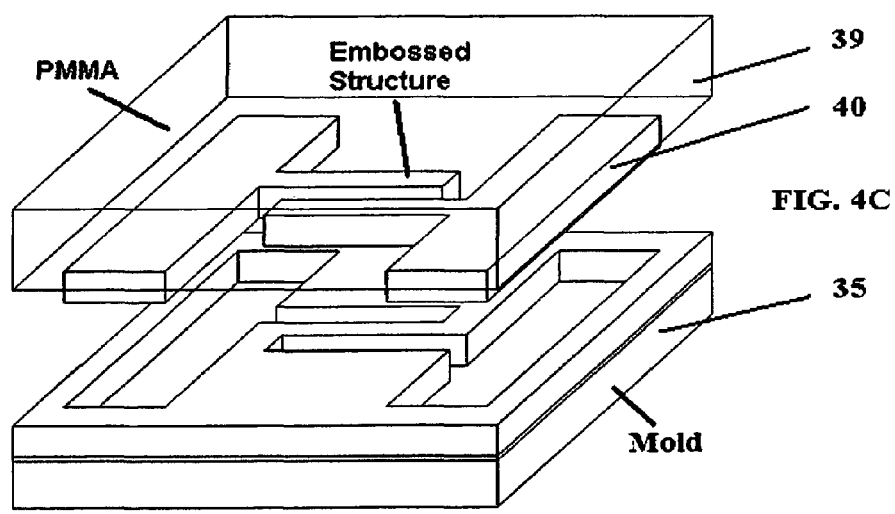
Figure 4D:
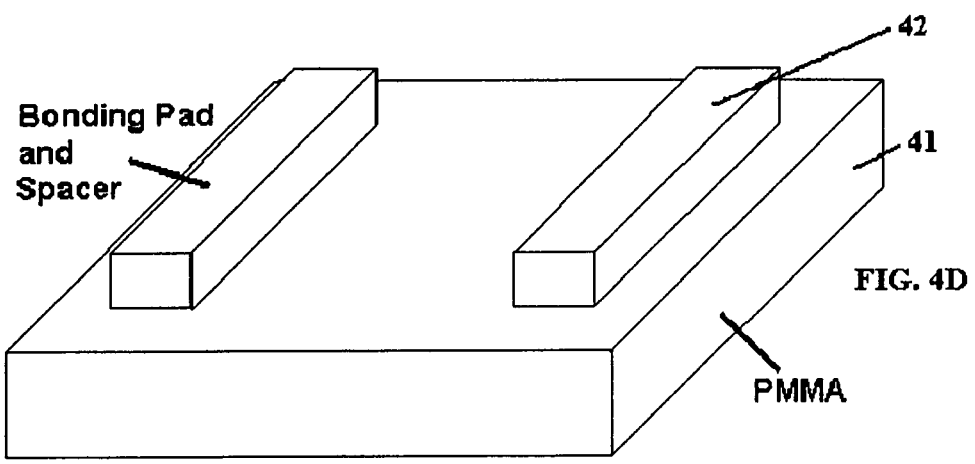
Figure 4E:
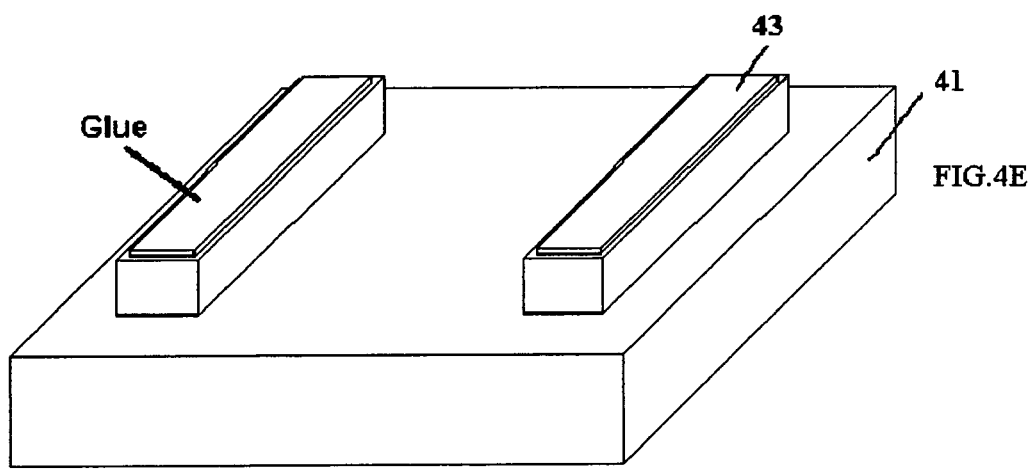
Figure 4F:
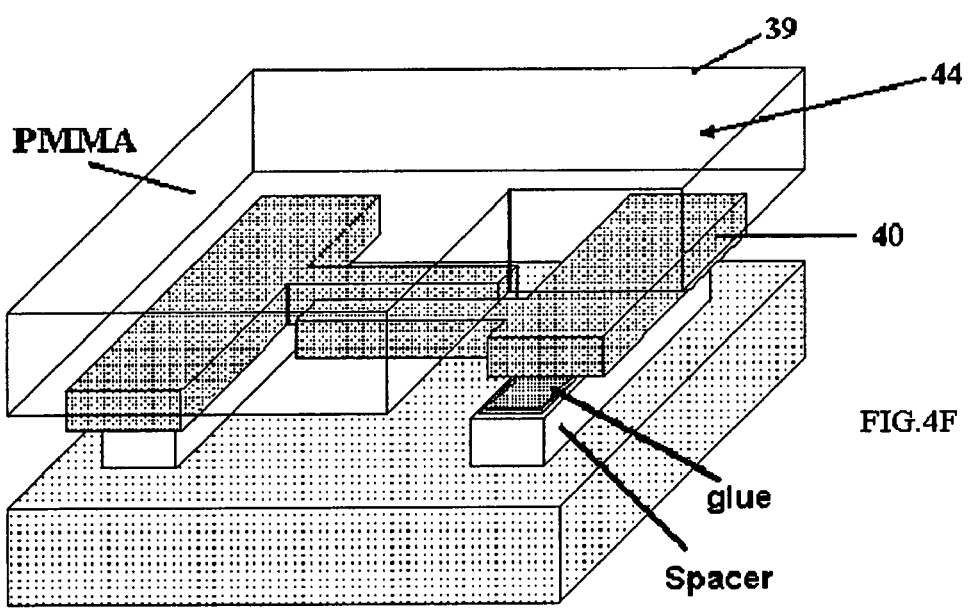
Figure 4G:
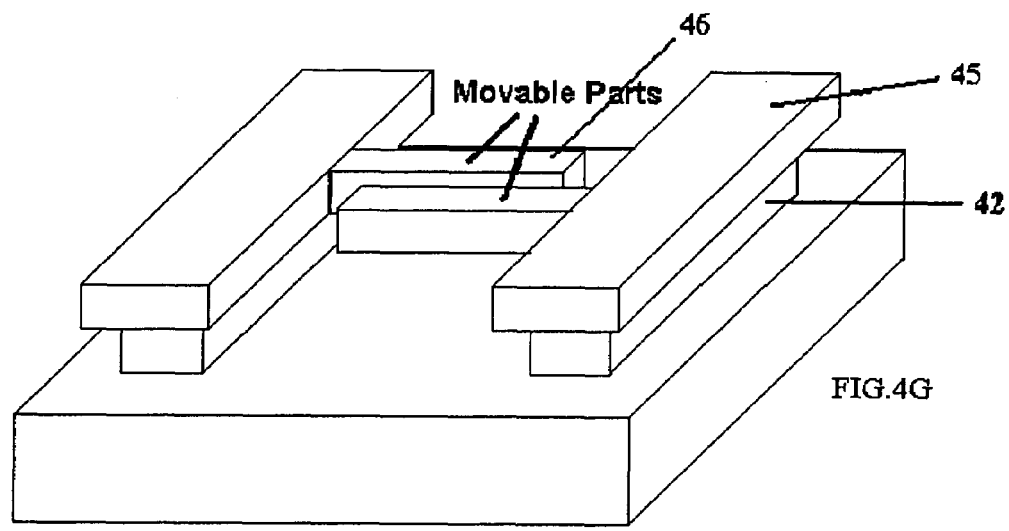
Figure 4H:
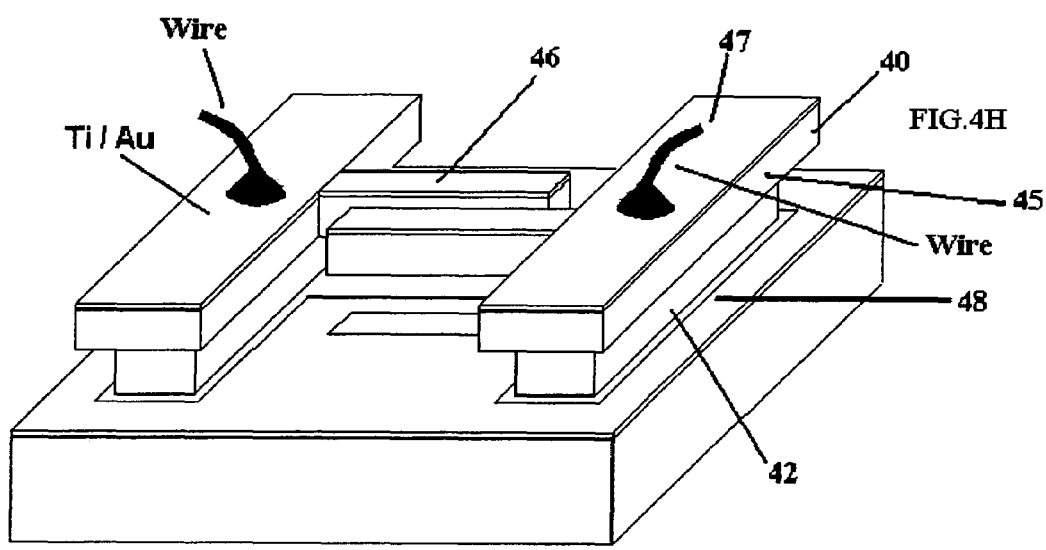

Another embodiment of the hot embossed polymeric tunneling sensor of the present invention is seen in FIGS. 4A–4I. FIG. 4A illustrates a conventional silicon on insulator (SOI) wafer 35. SOI wafer 35 consists of a Si/$SiO_2$/Si layer structure in the ratio of 60 μm/2 μm/500 μm. The orientation in FIG. 4A shows the 60 μm Si layer uppermost. FIG. 4A also shows a photoresist layer 37 with a pattern 38 formed therein with any conventional lithography technique (e.g., patterning with UV light and developing with a photodeveloper such as MF-319. The etching process is carried out using inductor coupled plasma (ICP) etching with a device such as the Alcatel A-601 from Alcatel Vacuum Technology, located in Annecy, France. The exposed silicon is etched until the $SiO_2$ layer 36 is reached as suggested in FIG. 4B. In order to remove "micro-grass" on the exposed $SiO_2$, a few minutes of over-etching with ICP is allowed or alternatively the wafer may be soaked in a standard KOH solution (e.g., 30%–45% by weight) for several minutes at 80–85° C. The pattern 38 shown is only a sample illustrative pattern to help demonstrate the fabri cation process. More complex patterns will normally be etched as shown below in reference to FIGS. 5A and 5B. Once the silicon mold is fabricated, it will be used for the hot embossing of a structure on a polymer sheet as described above. The polymer may again be PMMA and FIG. 4C illustrates the simple micro-structure 40 formed on the PMMA sheet 39. Next, a second PMMA micro-structure will be fabricated. Although the mold for this second PMMA micro-structure is not shown for the sake of simplicity, the second embossed micro-structure 42 see in FIG. 4D is formed on a second sheet 41 of PMMA material. These micro-structures 42 will act as bonding pads and spacers for joining with the micro-structure 40 on sheet 39. Next, a layer of adhesive 43 is applied to micro-structure 42 as in FIG. 4E and the sheet 39 is placed with its micro-structure 40) orientated downward on the adhesive 43 (FIG. 4F). The thickness of backside 44 of sheet 39 is progressively reduced until the micro-structure 40 is exposed from the back. In the embodiment shown, the thickness of backside 44 is about 500 μm and is initially sanded down to a thickness of approximately 50 μm. The remaining PMMA above microstructures 40 can then be removed with reactive ion etching (RIE). At this point, the structure illustrated in FIG. 4G is obtained. It can be seen how sections 45 are directly bonded to bonding pads 42 and are considered "fixed" sections of the structure. On the other hand, the projecting fingers 46 are not directly connected to the lower PMMA sheet and to the extent the PMMA is flexible, fingers 46 are considered movable sections of the structure. It is important to note that the bonding pads 42 have a height of about 100 μm and the lateral dimensions are about 200 μm less than the microstructures 40. This is to ensure that upon metallization, the various parts can be electrically isolated from one another as seen in FIG. 4H. FIG. 4H illustrates the structure after a Ti/Au layer 47, which in this embodiment is 300 Å/1000 Å thick, has been applied. It can be seen that because microstructure 40 is larger than bonding pads 42, micro-structure 40 creates an "overhang" that produces metal free areas 48 around the base of bonding pads 42 and ensures the electrical isolation discussed above. Additionally, wire leads 49 may be connected to the various parts of the metalized structure as required by a particular design.

Figure 5A:
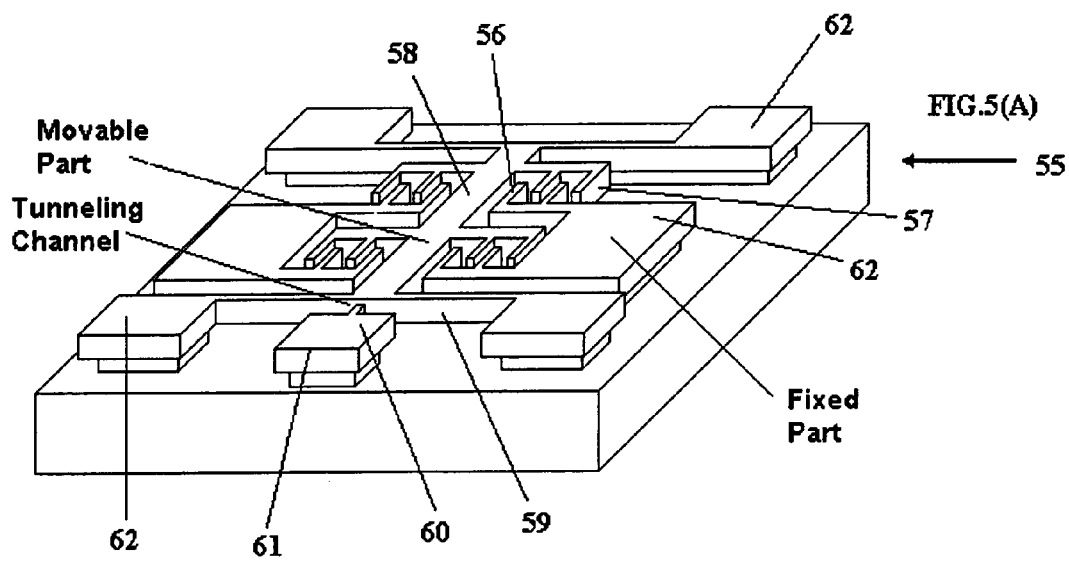
FIGS. 5A and 5B illustrate embodiments of comb-drive tunneling sensors according to the present invention.
Figure 5B:
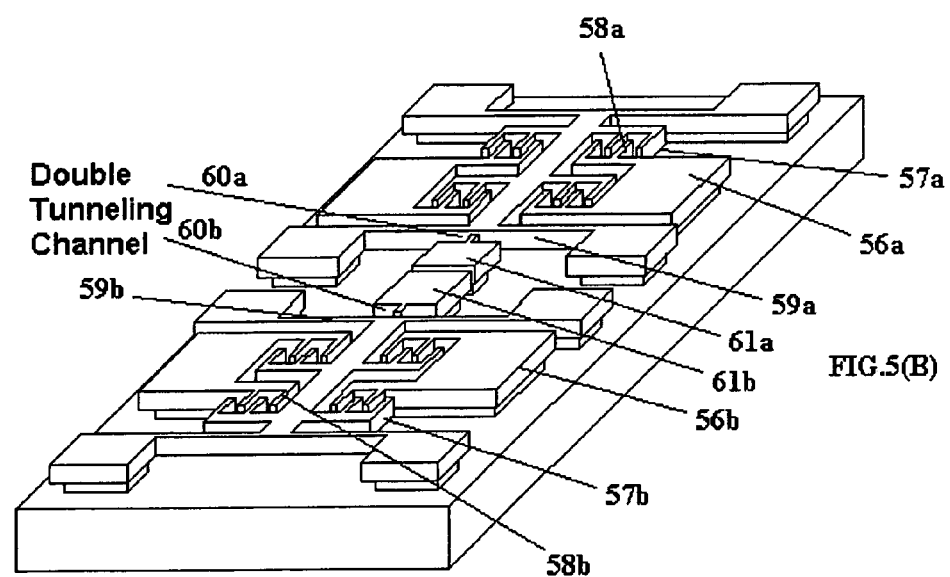

As mentioned, FIGS. 4A to 4H illustrate the fabrication process for the abstract micro-structure 40. The important point to note is how the process results in certain parts of the micro-structure being movable (at 46 in FIG. 4H) and certain parts being fixed (at 45 in FIG. 4G). FIGS. 5A to 5B illustrate a tunneling sensor of the comb drive variety which has been formed by the process in FIGS. 4A to 4H. In comb drive tunneling sensors, one set of comb fingers (designated 56 in FIG. 5A) will be fixed or stationary and will act as part of the deflection electrode. Another set of comb fingers will be comparatively movable (designated 57 in FIG. 5B) and will act as the biasing electrode. It will be understood that comb fingers 56 extend only a short distance from anchor sections 62 and therefore are comparatively fixed. On the other hand, comb fingers 57 are attached to central support 58 which is in turn attached to base supports 59. It is only the ends of base supports 59 that are attached to anchors 62. Because comb fingers 57 are connect to anchors 62 by comparatively long, thin sections (i.e., base supports 59) of comparatively flexible PMMA material, "movable" comb fingers 57 have a much greater ability to move than "fixed" comb fingers 56. A tunneling tip platform 61 having a tunneling tip 60 will be positioned adjacent to the lower base support 59. It can be seen that lower base support will act as the part of the deflection electrode which interacts with tunneling tip 60 and that the small gap between tunneling tip 60 and lower support base 59 forms the tunneling channel. Although, not shown in FIG. 5A, it will be understood that electrical leads will be attached at tunneling tip support 61 and at an anchor 62 for both fingers 56 and 57. With this structure, the comb drive sensor 55 will detect acceleration (i.e., movement of movable fingers 57 and base support 59) in the same manner as does sensor 1 in FIG. 1H.

The comb drive sensor 55 can also be constructed in the dual sensor configuration such as described in reference to FIGS. 2A and 2B above. FIG. 5B shows a comb driven tunneling sensor arrangement with a tunneling tip base 61 having two tunneling tips 60*a* and 60*b*. There is also two sets of movable comb fingers 57*a* and 57*b* and two sets of fixed comb fingers 58*a* and 58*b*. The movement of base supports 59*a* and 59*b* relative to tunneling tips 60*a* and 60*b* will provide the signals which will be input into an indifference input circuit as in FIG. 3. The comb drive tunneling sensor seen in FIG. 5B has been found to have a sensitivity of between 1 mg (micro-gravity) and 1 ng, which is comparable to silicon based sensors. The utility of tunneling sensors constructed using the above disclosed techniques is illustrated by the following examples.

EXAMPLE 1

This experiment involved the fabrication of silicon mold inserts by Inductive Coupled Etching (ICP). Current ICP processes can obtain aspect ratios of up to 40:1 and silicon molds have advantages (over conventional metal molds) such as fast and low-cost fabrication, flat surfaces, and suitable hardness, strength, and thermal conductivity. However, in practice ICP processes also have certain drawbacks which must be addressed. The two main drawbacks are area dependent etching (also called RIE lag) and micro-grass. This experiment presents an approach to overcome these two drawbacks through the fabrication of SOI (silicon on insulator) molds, and demonstrates the successful embossing of high-aspect-ratio micro-structures on PMMA.

"Area dependent etching" means that the etching depth is different for different open areas on a silicon wafer in the same process. In another words, the etching rate is faster for a wider trench than a narrower trench. The main reason is that the exchange rate of the reactive ions for etching silicon at the wider trench bottom is faster than at the narrower trench bottom. Another area dependent etching phenomena is that the profiles of the side walls are different between the narrower trench and the wider open area. In our experience, the side walls in large open areas normally get undercut, while the narrow trenches get vertical profiles. The main reason for the undercut in the large open areas is that the silicon wafer is often negatively charged by electrons. The incoming positive ions are deflected towards the sidewall by the static electrical force. In the narrower trench, the negative potentials on the two closed sidewalls are counteracted. The first area dependent etching phenomena will result in uneven heights on the final polymer micro-structures, the larger thickness for the larger open areas. This will further result in the difficulties either in design phase or in the following processes. The undercut in the big open area will cause problems, such as silicon mold cracking or rough PMMA side walls, in the demolding process.

Micro-grass often occurs at bottom of the etched large open areas. In an ICP process, there is the $C_xF_y$ polymer deposition phase as well as the etching phase. Micro-masks could be formed in the deposition phase. In addition, micro-masks could be also formed by masking material redeposition. The energetic reactive ions are highly collimated and the energetic ions cannot strike on the silicon surface underneath the micro-masks leaving them un-etched. Finally this un-etched silicon will become the micro-grass. This micro-grass could result in not only the coarse surface on embossed polymer structures but also the failure of the demolding process.

To overcome these problems from the ICP process, we fabricate the mold insert on a SOI wafer. The SOI wafer has the multi-layer structure as $Si/SiO_2/Si$ of 60/2/400 μm. The final experimental device is a displacement sensor based on the electron tunneling principle. Its key part is a lateral driven comb drive. The key dimensions are: (a) the initial distance between tunneling tip and its counterpart electrode which is also the movable beam of the comb drive is 5 μm, this makes the aspect ratio of our device 12:1; and (b) the finger width and the gaps between fingers of the comb drive are both 10 μm.

The ICP system is an Alcatel A-601 from Alcatel Vacuum Technology, located in Annecy, France and the $SF_6/C_4F_8$ gas system is used. The process pressure is 20 mTorr; the DC bias is about 50V; the wafer is cooled by 20° C. helium from the back side; and the etching rate is about 4 μm/min. The SOI wafer is also over etched for about 2 minutes to remove the micro-grass on the bottom. A good result is obtained having a uniform thickness and smooth bottom on a SOI wafer.

However, using a SOI wafer still can not eliminate the undercut in the large open areas. This problem is solved by optimum mask design. An assistant thin wall is added close to the side wall of the large area. The distance between the thin wall and the side wall of the large open area is several tens of microns so that a vertical trench is fabricated. The width of this assistant thin wall is decided by the total undercut. The best case is to etch the assistant wall totally through at the bottom by the end of the etching process. Even if there are several microns left at the bottom, this assistant wall will be easily removed by hot embossing during the first use due to the undercut. In our experiment, the width of the assistant wall is 4 μm.

In conclusion, a SOI wafer can be used to effectively overcome the drawbacks of ICP etching, such as area dependent etching and micro-grass. With a SOI wafer, a mold insert with an even thickness and a smooth surface at the trench bottom was fabricated successfully. In addition, with a SOI wafer an accurate thickness can be obtained without the precise control of the exact time and etching rate in the ICP process due to the self-stop characteristic of the $SiO_2$ layer. An assistant wall is an effective method to eliminate the undercut in any large open areas.

EXAMPLE 2

The mold is formed from a silicon wafer subject to ICP dry etching in order to create the desired pattern. The pattern selected is a comb drive similar to that which created the structure seen in FIG. 3B. A high-aspect-ratio trench with a sidewall profile at 90° can be achieved with ICP. In order to remove the micro-grasses, the wafer was soaked in the standard KOH solution at 70° C. for several minutes.

The hot embossing system employed is the HEX 01/LT, a commercial system from Jenoptik Mikrotechnik, located in Jena, Germany. The PMMA sheet is 0.5 mm thick with a glass transition temperature of 98° C. The entire fabrication procedures and parameters are the following: (1) open chamber and put PMMA on the substrate stage, (2) close chamber and evacuate it to 3 mTorr, (3) lower the mold to just touching the PMMA with a touch force of 300N, (4) heat mold and PMMA at the same time to 130° C. and keep this temperature for about 5 minutes, (5) insert the mold into PMMA under the molding force of about 35000N and maintain this force for 1 minute, (6) cool down the mold and PMMA to 85° C., (7) vent chamber and then demold. The whole processing cycle is about 20 minutes and good results are obtained using this process.

In order to provide the bonding pads, a second PMMA substrate with bonding pads is fabricated. As discussed above, the bonding pads also serve as spacers. The spacer height is about 100 μm. The substrate with the comb drive structures is flipped upside down and bonded onto the second PMMA substrate with epoxy. The spacers can be formed by either dry etching or hot embossing, but hot embossing is preferred because it is simple and fast. Dry etching requires much more complex lithography steps such as a metal masking layer, metal deposition, and strip-off processes.

After the two substrates are bonded together, the next step is to release the movable parts of the comb drive. The backside of the PMMA substrate is etched all the way down to the comb drive. Because the total thickness is about 500 μm, fast removal of PMMA is necessary. First, the PMMA was abraded and polished with fine sand papers close to the structures at about 50 μm. An even thickness of 20 to 30 μm can be easily achieved with this abrading method because the PMMA is very soft. Next, the remaining PMMA is etched by Reactive Ion Etching (RIE) using the gases of $O_2$ and $SF_6$. The etching rate is about 0.5 μm/min. Metallization is done by sputtering Ti/Au=300 Å/1000 Å after the structures are fully released. Next, wires are bonded on the bonding pads using conductive epoxy.

Figure 6:
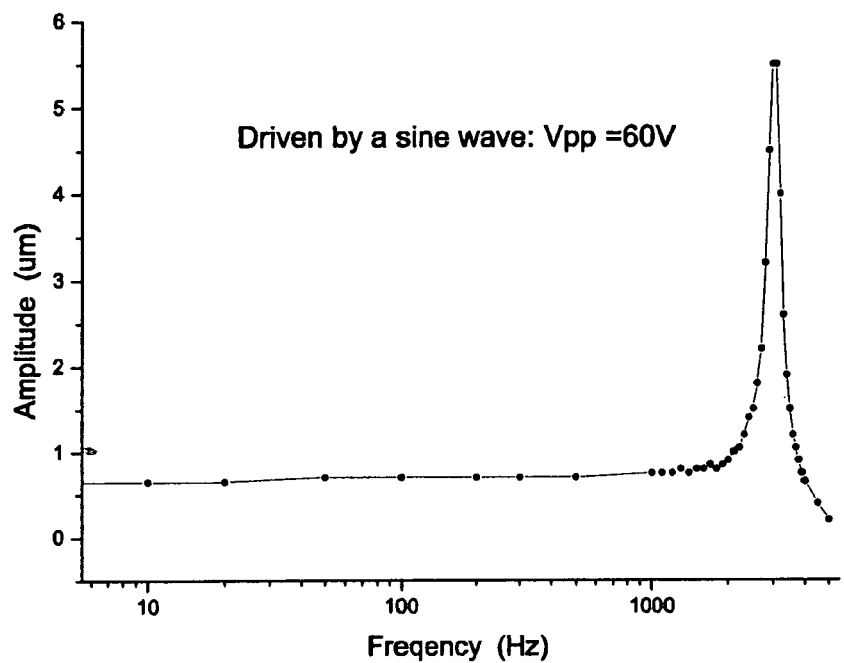
FIG. 6A illustrates the frequency of one embodiment of the tunneling sensor.
Figure 7:
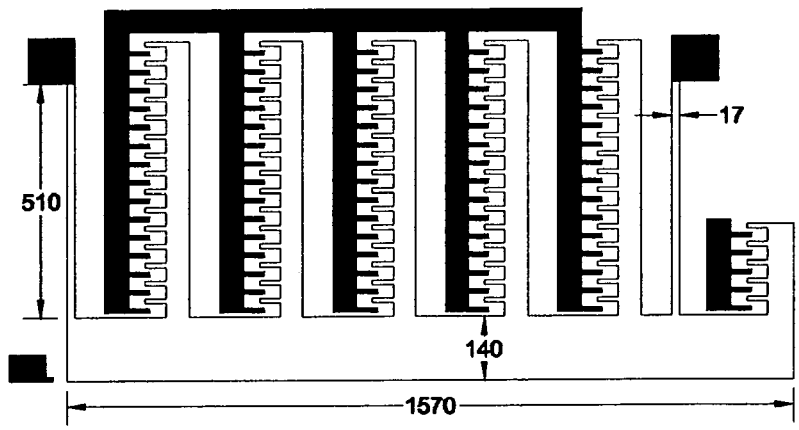
FIG. 7 illustrates the dimensions of one comb drive arrangement.

To test the comb drive, it is placed under a micro-scope with a CCD camera so that the micro-structures can be seen on a monitor. A high voltage generator is connected to the comb drive. The vibration of the movable fingers in accordance with the fixed part can be checked clearly on the monitor, while the applied voltage changes. A fixed tip electrode is fabricated close to the suspension beam of the moving part. The initial gap between the tip and the beam is 5 μm. Measurement shows that the suspension beam touches the tip under the applied voltage of about 180V. This voltage value is very close to computer simulation results run on this design. The natural frequency of the comb drive is measured with the following procedure. The system is driven by a sine wave voltage with the $V_{pp}$ of 60V. The vibration of the moving fingers is measured by a Digital Laser Doppler Vibrometer from Polytec Company. The result for our typical structure is shown in FIG. 6. The key dimensions of the structures are shown in FIG. 7 (the units μm). This measurement result also matches very well with the analytical calculation and numerical simulation. In the simulation of the resonant frequency with ANSYS 5.7 software, available from ANSYS Incorporated of Canonsburg, Pa., the quality factor Q has to be calculated analytically. The natural frequency about 2.6 kHz is obtained from the harmonic response analysis with ANSYS 5.7 after the Q value of 503 calculated manually is input. These values are comparable for conventional silicon based tunneling sensors.

This experiment shows that a comb drive can be successfully fabricated on PMMA by hot embossing. The testing results match the simulation very well. Several advantages of this technique observed in the experiment are as follows: (1) the whole process is simple and low cost, (2) all the procedures are performed at low temperatures, usually below 130° C., (3) PMMA structure has less stress and higher flexibility compared with the counterpart formed of silicon or poly-silicon, and (4) the driving voltage is also much lower compared with the silicon-based devices because PMMA has lower Young's modulus (i.e., $3\times10^9$ for PMMA and $2.3\times10^{10}$ for silicon). In fact, the driving voltage was found to be approximately eight times less for PMMA sensors as compared to silicon sensors.

EXAMPLE 3

In order to manufacture the silicon molds, double-side polished silicon (100) wafers coated with 2 μm thermal oxide are selected. When using KOH wet etching, $SiO_2$ layers are often used as the etching mask and since the etch ratio between $SiO_2$ and Si is about 1/100. The thickness of $SiO_2$ is chosen as 2 μm. In addition, the hot embossing process requires the molds to be bonded onto a holder, which requires the wafer have a smooth surface on its backside. The molds were designed to give a PMMA structure including a membrane of 30 μm in thickness and 2 mm×2 mm in square, a pyramid tunneling tip of 50 μm in height and 70 μm in base line, and a proof mass of 100 μm×100 μm in square and flexible in height. Small variations in the height are not generally critical since the sensors will be calibrated before use.

The preparation of silicon masters for hot embossing begins with KOH wet etching. Because KOH is a typical development liquid for positive photoresist, photoresist can not be used as the etching mask even if it has not been exposed. Most chemical etchants selectively etch either Si or $SiO_2$ without etching to the other. Silicon dioxide is extensively selected as the etching mask because KOH has negligible effect on it. A well-known system is thermal oxide coated silicon selectively etched by the buffered HF (hydrofluoric acid) to pattern the $SiO_2$, and then selective etchant KOH for the Si patterning. As seen in FIG. 8*a*, the $SiO_2$ is first patterned by positive photoresist (PR1813), and etched by diluted (Buffered Oxide Etchant) BOE, so that the etching rate can be well controlled at a relative slow rate of 800 Å/min. After that, the photoresist is removed by acetone, and the whole wafer is soaked into 45 wt % KOH etchant. The etchant is kept at 85° C. with a stirrer rotating at 200 rpm. The etching time is about 60 minutes with a rate of 1 μm per minute (FIG. 8*b*). Following that, another Buffered HF etching is performed after a second photolithography (FIG. 8*c*). The deep pyramid pits are then protected thoroughly with the photoresist because a plasma etching follows. The typically used high density plasma, $SF_6$ and $O_2$, will result in an isotropic undercut profile, which is unsuitable for hot embossing. When demolding, there occurs either the cracking of silicon master or the breaking of PMMA structures. Traditional etching by Bosch recipe, in which the gases switch between $SF_6/O_2$ and $C_4$ μg, does not work either, though it can achieve a vertical or positive taper profile, although a rather rough surface ("grass") is observed in the larger etched areas. This experiment uses a modified process; $SF_6$, $O_2$, and $C_4F_8$ are used simultaneously to acquire a vertical or positive sidewall profile and a smooth surface. As designed, there is a small distance between the tunneling tip and the counter electrode, about 5 μm, in order for it to be controllable. The depth of the groove is about 55 μm (FIG. 8*d*). After the first ICP (Inductive Coupling Plasma) etching, the wafer is cleaned, and another photolithography step is carried out (FIG. 8*e*). This time, the photoresist is much thicker since the second plasma etched groove will be about 80 to 100 μm, and will be changeable (to vary the proof mass) due to the sensor performance (FIG. 8*f*). Subsequently, the photoresist and the thermal oxide is removed, and the silicon mold is well cleaned (FIG. 8*g*), and ultimately is bonded to the Pyrex glass by the anodic bonding. The Pyrex glass will have approximately the same area as the silicon wafer, but is much thicker (about 5 mm) and provides strength to the otherwise fragile wafer when the wafer/Pyrex combination is installed and used in the embossing machine. The hot embossing is executed at a force of 20 kN with the temperatures of 165° C. for molding and 80° C. for demolding (FIG. 8*h*). The PMMA is then sliced into two parts, patterned with electrodes separately and assembled together by conductive epoxy glue (FIG. 8*j*). The final sensor would appear roughly similar as to that seen in FIG. 8*k*.

The most important part of a tunneling sensor is the tunneling tip since the tunneling current requires that the tip should be sharp enough to hold several atoms in a single layer. Therefore, the formation of the tip point in a silicon master is crucial. Next, the wet etching time is of importance because a non-well etched platform will result in no tunneling effect. Fortunately, the wet etching can continue after an inspection under micro-scope. The best etching time should be controlled within one minute. As described above, three types of chemicals, $SF_6$, $O_2$ and $C_4F_8$, give both isotropic chemical etching and anisotropic physical etching in the plasma etching. Positive and smooth sidewalls are obtained by optimizing the conditions as 200 sccm SF6, 20 sccm $O_2$ at 100 W (ICP), 20 W (bias), a working pressure of 60 mT, and a temperature of 10° C.

The glass transition temperature of PMMA is about 100~105° C., and the melting temperature is about 112~130° C. The molding temperature is set at 165° C., a little bit higher than the melting temperature in case of uncertainty. When molding, the chamber top is compressed down, with the mold's maximum contact force of 20 kN. The background pressure is about 1.5 mbar. The mold is kept under these working conditions for about 60 seconds while the temperature is cooling down. The demolding system is designed to overcome the holding forces between the tool and the PMMA sheet with the aid of compressed air, which is applied from the top of mold holder. In our case, the demolding temperature is set at 80° C. The speed of mold movement is 1 mm/min. The fabricated PMMA pyramids have smooth surfaces, sharp tip points, and steep edges, which are comparable with any tunneling tips acquired by micro-machining on silicon.

Similar to the traditional electrodes for a silicon-based tunneling sensor, two layers of Ti/Au metal films are sputtered on a PMMA sheet and patterned by $I_2$/KI solution (weight ratio: $I_2$:KI:$H_2$O=1:5:50) and BOE. As opposed to silicon baking at high temperatures, the PMMA substrates are dehydrated under vacuum after nitrogen dry blowing at high pressure. A Conductive Silver Epoxy Kit is used for both wire bonding and adhesive. The proof mass section and the tunneling tip section are glued together, and fixed onto a IC multiple-pin socket. The tunneling currents are measured when the feedback voltages are applied onto the deflection electrode. The exponential relationship between the tip tunneling currents and the applied deflection voltages is plotted in FIG. 9. Because the displacement is linearly proportional to the applied voltage on a capacitive actuator employed in the circuit, the tip current is proven to be a tunneling current.

In conclusion, the KOH wet anisotropic bulk etching and the improved deep reactive ion etching (ICP) using chemicals of $SF_6$, $O_2$, and $C_4F_8$ was successfully mixed together for a combinative etching technique in the preparation of silicon molds for the hot embossing process. There should be a small gap of less than 5 μm between the tunneling tip and the counter electrode. This is why the wet etching time needs to be well controlled. Since the sizes of proof masses need to be changeable and the heights of blocks are different, two other deep reactive ion etchings are required. Under the optimum conditions of ICP, the fabricated molds keep pyramid pits with the base angles of 54.73° and sharp edges. The sidewalls of blocks have smooth surfaces and positive profiles, which are critical for the demolding of hot embossing structures. Vertical PMMA-based tunneling sensors with membrane structures have been replicated by hot embossing with molding and demolding temperature of 165° C. and 80° C., respectively. The relationship between the tip currents and the deflection voltages shows that the tunneling current is exponential dependent on the displacement changes.

Although the present invention has been described in terms of specific embodiments, those skilled in the art will recognize many obvious variations and modifications. All such variations and modifications are intended to come within the scope of the following claims.

REFERENCES

The following references are incorporated by reference herein in their entirety.

[1] Roos, N., et al, "Nanoimprint lithography with a commercial 4 inch bond system for hot embossing," *Proceedings of SPIE—The International Society for Optical Engineering*, v 4343, 2001, pp 427–435

[2] Heyderman, L. J., et al, "Nanofabrication using hot embossing lithography and electroforming," *Micro-electronic Engineering*, v 57–58, September, 2001, pp 375–380

[3] Scheer, H.-C, et al, "Strategies for wafer-scale hot embossing lithography," *Proceedings of SPIE—The International Society for Optical Engineering*, v 4349, 2001, pp 86–89

[4] Lee, G-B, et al, "Micro-fabricated plastic chips by hot embossing methods and their applications for DNA separation and detection," *Sensors and Actuators, B: Chemical*, v 75, n 1–2, Apr. 30 2001, 2001, p 142–148

[5] Becker, H., at al, "Micro-fluidic devices for μ-TAS applications fabricated by polymer hot embossing," *Proceedings of SPIE—The International Society for Optical Engineering*, v 3515, 1998, pp 177–182

[6] Holger Becker, Ulf Heim, "Hot embossing as a method for the fabrication of polymer high aspect ratio structures," *Sensors and Actuators, A: Physical*, v83, n1,2000, pp. 130–135

[7] Holger Becker, Ulf Heim, "Silicon as tool material for polymer hot embossing" *Proceeding MEMS* 99, 1999, pp. 228–231

[8] K.-D. Muller, et al, "3D Diced Micro-components Fabricated by Multi-layer Hot Embossing," *MME '99: Micromechanics Europe, Gif-sur-Yvette, F*, Sep. 27–28, 1999

[9] Roetting, Oliver, et al, "Production of movable metallic micro-structures by aligned hot embossing and reactive ion etching," *Proceedings of SPIE—The International Society for Optical Engineering*, v 3680, pp. 1038–1045

[10] Liwei, Lin, et al, "Micro-fabrication using silicon mold inserts and hot embossing," *Proceedings of the International Symposium on Micro-Machine and Human Science*, 1996, pp. 67–71

[11] C. F. Quate, et al., "Tunneling Accelerometer", *Journal of Micro-scopy*, 152, pp. 73–76, 1988

[12] S. B. Waltman and W. J. Kaiser, "An electron tunneling sensor," *Sensors Actuators, vol*. 19, pp. 201–210, 1989

[13] T. W. Kenny, S. B. Waltman, J. K. Reynolds, and W. J. Kaiser, "Micro-machined silicon tunneling sensor for motion detection," *Appl. Phys. Lett.* Vol. 58, pp. 100–102, 1991a.

[14] W. C. Tang, T. H. Nguyen and R. T. Howe, "Laterally Driven Polysilicon Resonant Micro-structures," in *Tech. Dig. IEEE Micro-Electro Mech. Syst. Workshop*, Salt Lake City, Utah, Feb. 20–22, 1989, pp. 53–59

[15] W. C. Tang, "Electrostatic comb drive for resonant sensor and actuator application," Ph. D. dissertation, Univ. California, Berkeley, Calif., 1990

[16] Johnson and Larry K. Warn, "Electrophysics of Micromechanical Comb Actuators," *Journal of Micro-electromechanical Systems*, vol. 4, 1995, pp. 49–59

[17] Wenjing Ye and Subrata Mukherjee, "Optimal Shape Design of Three-Dimensional MEMS with Applications to Electrostatic Comb Drives," *International Journal for Numerical Methods in Engineering*, 45, 1999, pp. 175–194

[18] Wenjing Ye, Subrata Mukherjee, and Norl C. MacDonald, "Optimal Shape Design of an Electrostatic Comb Drive in Micro-electromechanical Systems," *Journal of Micro-electromechanical Systems*, vol. 7, 1998, pp. 16–26

[19] M. Steven Rodgers, Sridhar Kota, et al. "A New Class of High Force, Low-Voltage, Compliant Actuation Systems," www.mems.sandia.gov

[20] J. L. Andrew Yrh, Chung-Yuen Hui and Norman C. Tien, "Electrostatic Model for an Asymmetric Comb-drive," *Journal of Micro-electromechanical Systems*, vol. 9, 2000, pp. 16–26

[21] Edward K. Chan and Robert W. Dutton, "Electro-static Micro-mechanical Actuator with Extended Range of Travel," *Journal of Micro-electromechanical Systems*, vol. 9, 2000, pp. 321–328

[22] Toshiki Hirano, Tomotake Furuhata, Kaigham J. Gabriel and Hiroyuki Fujita, "Design, Fabrication, and Operation of Submicron Gap Comb-Drive Micro-actuators," *Journal of Micro-electromechanical Systems*, vol. 1, 1992, pp. 52–59

[23] Pamela R. Patterson, et al, "A Scanning Micro-mirror with Angular Comb Drive actuation," 15*th IEEE International Conference on Micro-Electromechanical Systems*, 2002, pp. 544–547

We claim:

1. A polymer based micro-machine formed by the steps comprising:
   a. forming a first and second mold, each having a design formed through a lithography process;
   b. transferring said design on each mold to a separate polymer substrate through a hot embossing process;
   c. depositing a metal layer over at least part of said designs; and
   d. connecting at least one electrical lead to said metal layer.

2. The polymer based micro-machine according to claim 1, wherein said design is a structure for a tunneling current sensor.

3. The polymer based micro-machine according to claim 1, further including the step of adhering said separate substrates together.

4. The polymer based micro-machine according to claim 1, further including the step of back etching at least one of said polymer substrates.

5. The polymer based micro-machine according to claim 1, wherein said step of transferring said design includes using PMMA as the polymer substrate.

6. The polymer based micro-machine according to claim 1, wherein said metal layer is deposited over substantially all of a surface containing said design and is etched to conform to said design.

7. The polymer based micro-machine according to claim 1, wherein said design structure is a comb drive.

8. The polymer based micro-machine according to claim 1, wherein said separate polymer substrates are metalized and bonded together.

9. A polymer based micro-machine formed by the steps comprising:
   a. forming a mold of a comb drive structure through a lithography process;
   b. transferring said design to a polymer substrate through a hot embossing process;
   c. depositing a metal layer over at least part of said design; and
   d. connecting at least one electrical lead to said metal layer.

10. A polymer based micro-machine formed by the steps comprising:
   a. forming a mold of a design for a tunneling current sensor through a lithography process;
   b. transferring said design to a polymer substrate through a hot embossing process;
   c. depositing a metal layer over at least part of said design; and
   d. connecting at least one electrical lead to said metal layer.

* * * * *